United States Patent
Shetty et al.

(10) Patent No.: US 12,323,140 B2
(45) Date of Patent: Jun. 3, 2025

(54) INTEGRATED CIRCUIT (IC) WITH WIDE-RANGE I/O SUPPLY

(71) Applicant: TEXAS INSTRUMENTS INCORPORATED, Dallas, TX (US)

(72) Inventors: Sneha Shetty, Bangalore (IN); Rajesh Yadav, Bangalore (IN)

(73) Assignee: Texas Instruments Incorporated, Dallas, TX (US)

(*) Notice: Subject to any disclaimer, the term of this patent is extended or adjusted under 35 U.S.C. 154(b) by 164 days.

(21) Appl. No.: 17/975,880

(22) Filed: Oct. 28, 2022

(65) Prior Publication Data

US 2023/0396251 A1 Dec. 7, 2023

Related U.S. Application Data

(60) Provisional application No. 63/348,353, filed on Jun. 2, 2022.

(51) Int. Cl.
*H03K 19/0175* (2006.01)

(52) U.S. Cl.
CPC ............ *H03K 19/017509* (2013.01)

(58) Field of Classification Search
None
See application file for complete search history.

(56) References Cited

U.S. PATENT DOCUMENTS

| | | | |
|---|---|---|---|
| 2011/0254591 A1* | 10/2011 | Monga | H03K 19/018528 326/80 |
| 2020/0105316 A1* | 4/2020 | Sridharan | H03K 17/687 |
| 2020/0235737 A1* | 7/2020 | Yim | G06F 3/0605 |

* cited by examiner

*Primary Examiner* — Jany Richardson
(74) *Attorney, Agent, or Firm* — Andrew R. Ralston; Frank D. Cimino

(57) ABSTRACT

An I/O module configured to operate over a range of voltage supplies includes a transmit path circuit and a receive path circuit that are each configured to convert a data signal between a core voltage domain and one of a first voltage domain (e.g., a high voltage domain) and a second voltage domain (e.g., a low voltage domain) in response to a mode select signal.

24 Claims, 10 Drawing Sheets

600A

RECEIVE PATH CIRCUIT - TRANSMISSION GATE STATE

| VOLTAGE DOMAIN | PGATE | NGATE | COMMENT |
|---|---|---|---|
| 1.2V/1.8V | 0 | 1 | MN42 AND MP40 ON, LV PATH USED TO RECEIVE SIGNAL |
| 3V/5V | PAD | 0 | MN42, MP40 OFF, HV PATH USED TO RECEIVE SIGNAL |

RECEIVE PATH CIRCUIT - DIGITAL SIGNAL STATES (IN VDDIO AND VCORE DOMAINS)

| VOLTAGE DOMAIN | MODE (VCORE) | ENABLE_HV (VDDIO) | ENABLE_LV (VDDIO) | MIO_LV_N (VDDIO) | MCORE_LV (VCORE) | MCORE_LV_N (VCORE) | MCORE_HV (VCORE) | MCORE_LV_N (VCORE) |
|---|---|---|---|---|---|---|---|---|
| 1.2V/1.8V | 1 | 0 | 1 | 0 | 1 | 0 | 0 | 1 |
| 3V/5V | 0 | 1 | 0 | 1 | 0 | 1 | 1 | 0 |

INTEGRATED CIRCUIT (IC) WITH WIDE-RANGE I/O SUPPLY

CROSS-REFERENCE TO RELATED APPLICATIONS

This non-provisional application claims priority based upon U.S. provisional Application No. 63/348,353, filed Jun. 2, 2022, which is hereby incorporated by reference in its entirety.

FIELD OF THE DISCLOSURE

Disclosed implementations relate generally to the field of IC design and fabrication. More particularly, but not exclusively, the disclosed implementations relate to an IC device having an input/out (I/O) module operable with a wide range of voltage supplies.

BACKGROUND

Wide range I/Os (e.g., operable over 1.08 V-5.5 V) may be needed for IC designs to be voltage compatible with different supply domain interfaces at system level. Further, the I/O may be required to be failsafe and operate at a same frequency across the supply range while also meeting reliability criteria as well as timing performance criteria.

SUMMARY

The following presents a simplified summary in order to provide a basic understanding of some examples of the present disclosure. This summary is not an extensive overview of the examples, and is neither intended to identify key or critical elements of the examples, nor to delineate the scope thereof. Rather, the primary purpose of the summary is to present some concepts of the present disclosure in a simplified form as a prelude to a more detailed description that is presented in subsequent sections further below.

Examples of the present disclosure are directed to an IC device having an I/O module configured to operate over a range of voltage supplies, wherein a transmit path circuit and a receive path circuit are each implemented to include two separate circuit portions, one configured for high voltage mode operations and the other configured for low voltage mode operations. A mode select signal may be provided for selecting between the two modes depending on the supply voltage domain of an application environment.

In one example, an IC is disclosed, which comprises, inter alia, on-chip circuitry configured to operate in a core voltage domain; and an I/O module coupled to the on-chip circuitry, the I/O module configured to transmit to and receive data from an I/O node, the I/O module comprising a transmit path circuit and a receive path circuit, wherein the transmit path circuit and the receive path circuit are each operable to convert a data signal between the core voltage domain and one of a first voltage domain and a second voltage domain responsive to a mode select signal.

In another example, an IC is disclosed, which comprises, inter alia, on-chip circuitry configured to produce a core data signal at a core voltage level; and I/O module including: a transmit data circuit configured to generate a transmit data signal from the core data signal in a first voltage domain by a first transmit data path or in a second voltage domain by a second transmit data path, to select the first or the second transmit data path responsive to a mode select signal, and to direct the transmit data signal to an I/O node. In one arrangement, the transmit data circuit comprises a first pull-up portion operable in the first voltage domain responsive to the mode select signal in a first logic state; and a second pull-up portion operable in the second voltage domain responsive to the mode select signal in a second logic state, wherein the first and second pull-up portions may be selectively actuated in response to a plurality of control signals generated by a core logic module associated with the I/O module.

In another example, an IC is disclosed, which comprises, inter alia, an I/O module including: a receive data circuit configured to generate a core data signal from a received data signal from an I/O node by a first receive data path if the received data signal is in a first voltage domain or by a second receive data path if the received data signal is in a second voltage domain, wherein the first receive data path or the second receive data path are selected responsive to a mode select signal; and on-chip circuitry configured to propagate the core data signal at a core voltage level. In one arrangement, the receive data circuit comprises: a first receive portion operable in the first voltage domain responsive to the mode select signal in a first logic state; and a second receive portion operable in the second voltage domain responsive to the mode select signal in a second logic state, wherein the first and second receive portions may be selectively actuated by in response to a plurality of control signals generated by a core logic module associated with the I/O module.

In another example, a method of fabricating an IC device is disclosed. The method may comprise, inter alia, forming an on-chip circuitry portion over a semiconductor substrate, the on-chip circuitry portion configured to operate in a core voltage domain; and forming an I/O module coupled to the on-chip circuitry portion, the I/O module configured to transmit to and receive data from an I/O node, the I/O module comprising a transmit path circuit and a receive path circuit, the transmit path circuit and the receive path circuit each operable to convert a data signal between the core voltage domain and one of a first voltage domain and a second voltage domain responsive to a mode select signal. In one arrangement, the transmit path circuit may be formed to include a high voltage path portion and a low voltage path portion, wherein the low voltage path portion may be formed using drain extended MOS (DEMOS) devices. In one arrangement, the receive path circuit may be formed to include a high voltage path portion and a low voltage path portion, wherein the low voltage path portion may be formed using core voltage devices that may be protected during high voltage operations in a circuit configuration involving DEMOS devices.

BRIEF DESCRIPTION OF THE DRAWINGS

Implementations of the present disclosure are illustrated by way of example, and not by way of limitation, in the Figures of the accompanying drawings. It should be noted that different references to "an" or "one" implementation in this disclosure are not necessarily to the same implementation, and such references may mean at least one. Further, when a particular feature, structure, or characteristic is described in connection with an implementation, it is submitted that it is within the knowledge of one skilled in the art to effect such feature, structure, or characteristic in connection with other implementations whether or not explicitly described.

The accompanying drawings are incorporated into and form a part of the specification to illustrate one or more example implementations of the present disclosure. Various advantages and features of the disclosure will be understood from the following Detailed Description taken in connection with the appended claims and with reference to the attached drawing Figures in which:

FIGS. 6A and 6B depict representative signal states and device states effectuated in a receive path circuit during different voltage modes operation according to some examples of the present disclosure.

DETAILED DESCRIPTION

Figure 1:
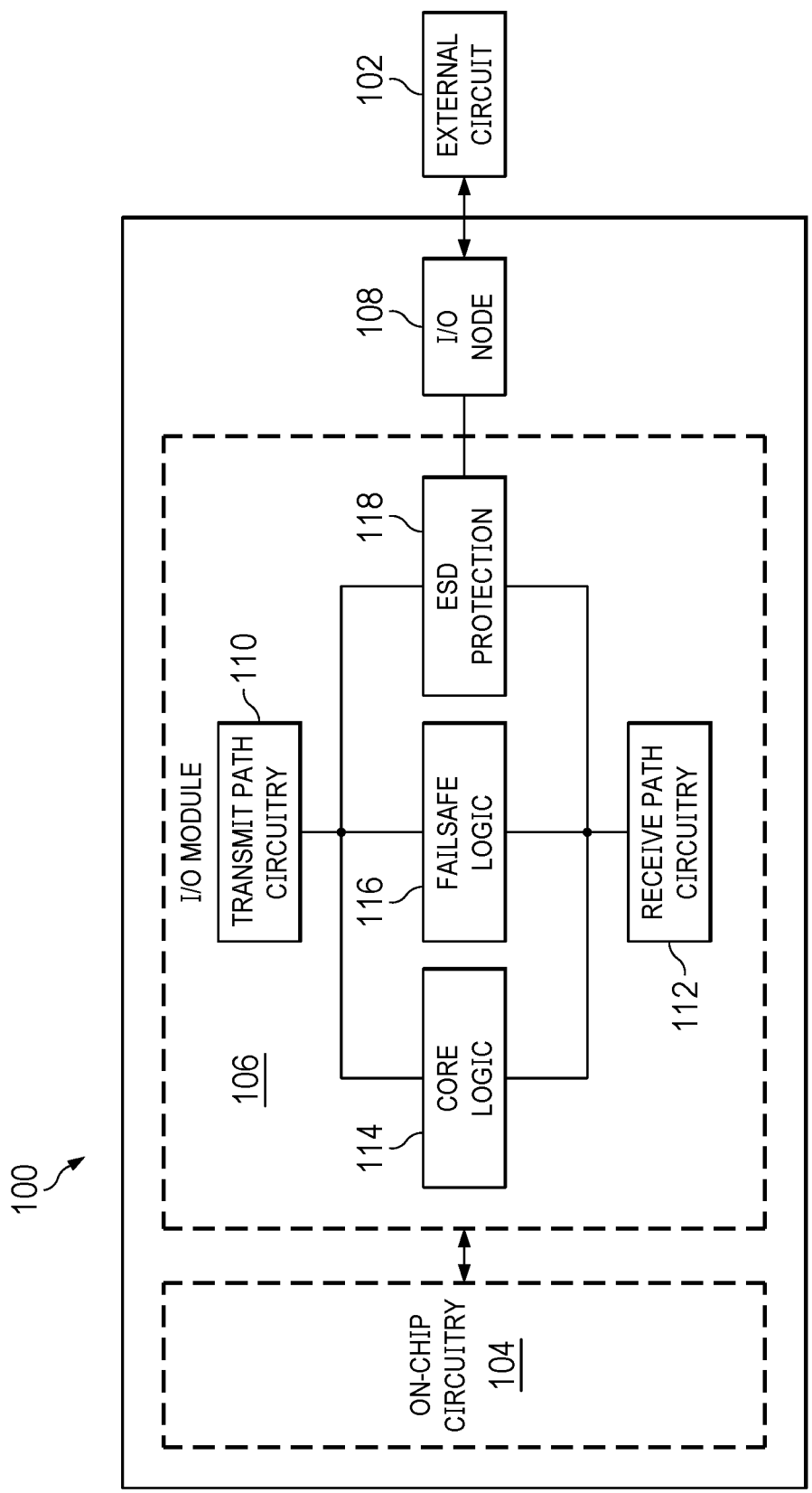
FIG. 1 depicts a representative integrated circuit (IC) device having an input/output (I/O) module configured to operate at a wide range of supply voltages according to some examples of the present disclosure.

Examples of the disclosure are described with reference to the attached Figures wherein like reference numerals are generally utilized to refer to like elements. The Figures are not drawn to scale and they are provided merely to illustrate examples. Numerous specific details, relationships, and/or methods are set forth below to provide an understanding of one or more examples. However, it should be understood that some examples may be practiced without such specific details. In other instances, well-known subsystems, circuits, components, structures and techniques have not been shown in detail in order not to obscure the understanding of the examples. Accordingly, it will be appreciated by one skilled in the art that the examples of the present disclosure may be practiced without such specific components, structures or subsystems, etc.

Additionally, terms such as "coupled" and "connected," along with their derivatives, may be used in the following description, claims, or both. It should be understood that these terms are not necessarily intended as synonyms for each other. "Coupled" may be used to indicate that two or more elements, which may or may not be in direct physical or electrical contact with each other, co-operate or interact with each other. "Connected" may be used to indicate the establishment of communication, i.e., a communicative relationship, between two or more elements that are coupled with each other. "Directly connected" may be used to convey that two or more physical features touch, or share an interface between each other. Further, in one or more examples set forth herein, generally speaking, an element, component or module may be configured to perform a function if the element may be programmed for performing or otherwise structurally arranged to perform that function.

Referring to the drawings, FIG. 1 depicts a representative integrated circuit (IC) device 100 having an I/O module 106 configured to operate at a wide range of supply voltages according to some examples of the present disclosure. Depending on implementation, IC device 100 may be deployed in a variety of applications, e.g., including but not limited to audio applications, telecommunications applications, automotive applications, digital signal processing applications, optical networking applications, digital control applications, Internet-of-Things (IoT) applications, etc., wherein the IC device 100 may be disposed in a communicative relationship with one or more external circuits, e.g., external circuit 102, for transmitting data thereto and/or receiving data therefrom via one or more pads coupled to respective I/O nodes, e.g., node 108, driven by the I/O module 106. In example arrangements, external circuit(s) 102 may be operable in a broad range of voltage domains depending on the application environment and may be configured to communicate with the IC device 100 using a variety of communication architectures, protocols, specifications and/or standards. Accordingly, the I/O module 106 may be advantageously configured in some examples to operate in different voltage modes for facilitating data transfer between internal on-chip circuitry 104 of the IC device 100 that may be operable in one voltage domain and the external circuit 102 that may operable in a different voltage domain, as will be set forth in detail further below.

Depending on implementation, IC device 100 may be fabricated using a variety of semiconductor technologies and/or process flows, wherein on-chip circuitry 104 may comprise any combination of known or heretofore unknown electronic circuits, modules or blocks, etc., e.g., processors, microcontrollers, volatile and nonvolatile memories, logic circuitry, power management circuitry, Application Specific Integrated Circuits (ASICs), Field Programmable Gate Array (FPGA) circuits, programmable system device (PSD) circuitry, System-on-Chip (SoC) circuitry, digital/analog/mixed-signal circuitry, and the like. In some example arrangements, on-chip circuitry 104 may be configured to operate in a core voltage domain, e.g., at a core voltage level, which may include chip level logic circuitry (e.g., bus master logic and associated configuration registers) that may be configured to generate appropriate control signals for enabling the operation of the I/O module 106 in different communication modes, e.g., transmit (Tx) mode and/or receive (Rx) mode, depending on whether an I/O pad is configured as an output or an input in a particular application. In some example arrangements, the I/O module 106 may include a core logic module 114 operable at the core voltage level to generate control signals configured to control Tx mode operations and Rx mode operations at different voltage levels or domains based upon the application environment. Accordingly, a transmit path circuit 110 and a receive path circuit 112 may be provided as part of the I/O module 106, which may be configured for converting a data signal between the core voltage domain and one of a first voltage domain (e.g., a high voltage (HV) domain) and a second voltage domain (e.g., a low voltage (LV) domain). It should be appreciated that voltage levels corresponding to the core voltage domain as well as the first and second voltage domains may vary depending on implementation. In general, core voltage levels may be dependent on the semiconductor technology used for fabricating the IC device 100. In an example implementation where 65-nanometer (nm) technology is used, a core voltage (VCORE) of 1.5 V may be provided as operating voltage in the core voltage domain. In similar fashion, example first and second voltage domains may be effectuated based on the voltage levels of an application environment in which the external circuit 102 may be disposed. In some arrangements, voltage levels of 1.2 V-1.8

V may be provided as supply voltages for LV domain operations and voltage levels of 3.3 V-5 V may be provided as supply voltages for HV domain operations.

In some arrangements, a mode select signal may be provided for selectively enabling different portions of the transmit and receive path circuits 110, 112 appropriately in order to facilitate the selection between HV and LV domain operations as will be set forth in detail further below. In some examples, the mode select signal may be generated by a separate chip level logic module. In one arrangement, the mode select signal may be generated responsive to sensing a voltage level at an I/O pad to which an external circuit may be connected. Relatedly, the mode select signal may be generated in response to comparing a reference voltage configured for defining LV and HV operations. In some examples, a failsafe (F/S) module 116 may be provided with suitable logic for facilitating failsafe operations, e.g., driving an I/O pad to a predetermined voltage level (e.g., 5.5 V) while the IC device 100 is being powered up and the internal voltage levels are fluctuating. In one arrangement, F/S module 116 may also be operable to drive appropriate logic levels on one or more control signals to facilitate Tx and Rx operations in different modes as will be seen below. Further, the I/O module 106 may also include electrostatic discharge (ESD) protection circuitry 118, which may be based on Charged-Device Model (CDM) diode circuitry or similar circuitry, in order to protect the IC device 100 against ESD transients.

In some examples, the transmit path and receive path circuits 110, 112 may each be implemented to include separate, parallel circuit portions or paths for operating in HV and LV domains, respectively, wherein each path in the LV domain may be built using asymmetrical MOS devices such as drain extended MOS (DEMOS) devices that can withstand higher voltage levels at the drain terminals, as well as transistor devices operable with core voltages, which can be enabled during low voltage operations (e.g., in the 1.2 V/1.8 V domain) with lower threshold voltages ($V_{th}$) in order to meet timing constraints that may be required by lower supply voltages. In example arrangements, reliability of LV devices while the I/O module is engaged in high voltage operations (e.g., in the 3.3 V/5 V domain) may be assured by design wherein the asymmetrical nature of DEMOS devices is exploited, which provides for higher breakdown levels between the drain and the gate terminals ($V_{DG}$) on one side of the 1.8 V DEMOS devices. As will be set forth in further detail below, various transistor devices forming the HV and LV domain portions of the Tx and Rx path circuitry, which are operable at different voltage levels, may be selectively actuated responsive to appropriate control signals as well as the mode select signal in order that I/O performance characteristics as well as device integrity may be maintained over a broad range of voltages that may be encountered in a variety of I/O applications.

Figure 2:
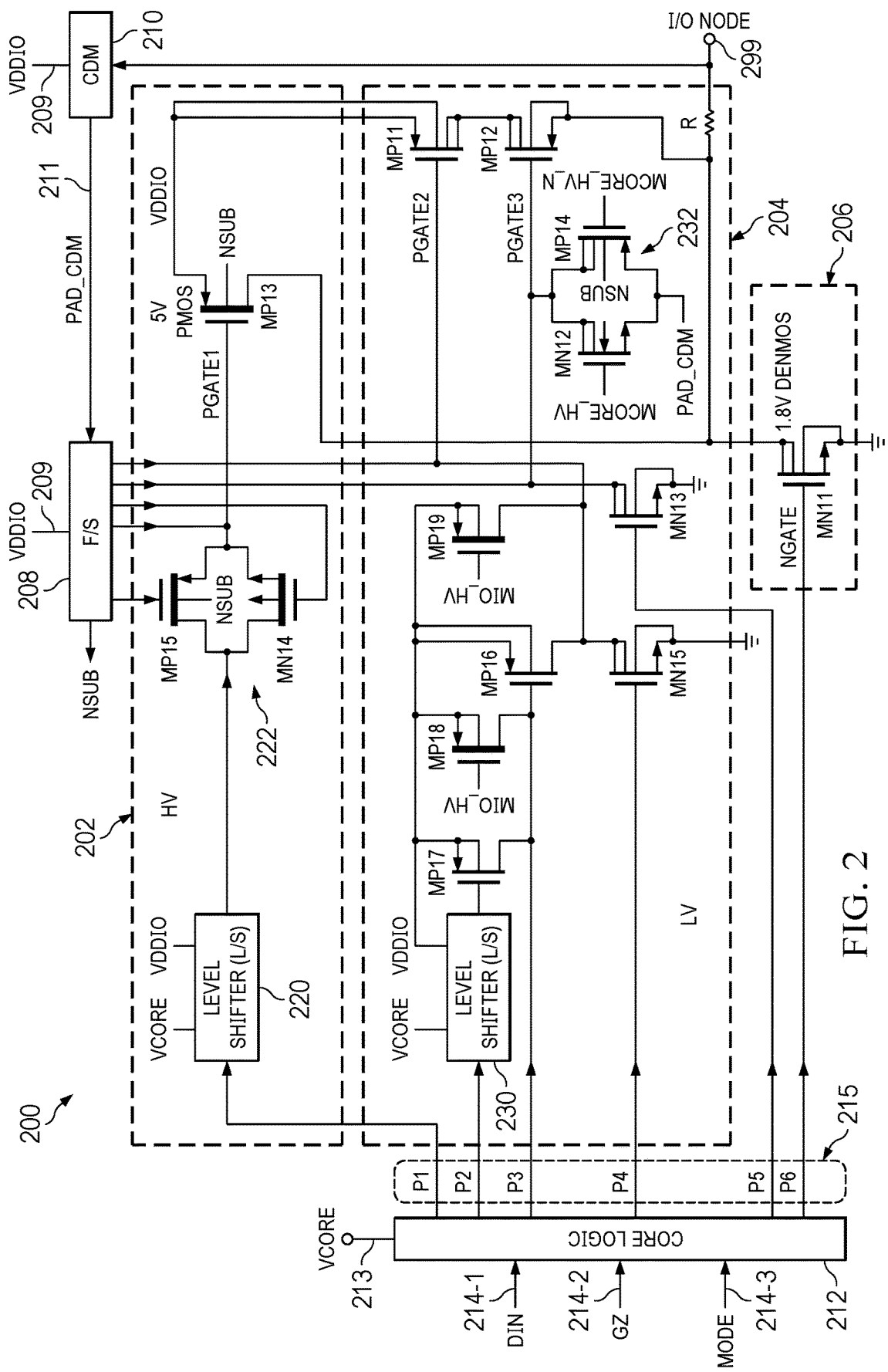
FIG. 2 depicts a schematic block diagram of a transmit path circuit of an I/O module according to some examples of the present disclosure.

FIG. 2 depicts a schematic block diagram of a transmit path circuit 200 of an I/O module according to some examples of the present disclosure, wherein various types of transistor devices may be illustratively distinguished for sake of convenience. By way of example, DEMOS devices, which are operable at 1.8 V in one implementation, may be shown with an additional line on the drain side, e.g., MN11, MN13, MN12, MN15, MP11, MP12, and MP14. In one example representation, HV compatible MOS devices (e.g., 5 V MOS devices) may be shown with a thick channel, e.g., MN14, MP18, etc., and core voltage MOS devices (e.g., 1.8 V MOS devices) may be shown with a thin channel, e.g., MP16, MP17, etc. In one arrangement, the transmit path circuit 200 may include two parallel pull-up paths or portions 202, 204 and a pull-down path or portion 206. A core logic module 212 operable at a core voltage VCORE 213 may be configured to generate a plurality of control signals, e.g., transmit path control signals p1-p6, collectively referred by reference number 215, based on a data (DIN) signal 214-1, a transmit enable (GZ) signal 214-2 and a mode select (MODE) signal 214-3, wherein the data signal 214-1 may comprise a sequence of binary values (e.g., 1's and 0's corresponding to logic high values or logic low values according to an example implementation) propagating from an on-chip circuit portion of an IC device, e.g., IC device 100, for transmission at suitable data rates/frequencies. In an example arrangement, voltage levels corresponding to logic high values of the data signal 214-1 may be dependent on the core voltage levels operable with the voltage domain in which the core logic module 212 and associated on-chip circuitry is disposed. Depending on implementation, GZ signal 214-1 may be generated by a chip level control block (not shown in this FIG.) for enabling the transmit path circuit 200 of an I/O module in response to configuring a corresponding I/O pad of the IC device as an output based on the requirements of an application scenario. In one arrangement, MODE signal 214-3 may be provided by way of a software controlled register or generated using one or more voltage comparators depending on implementation. A failsafe (F/S) module 208 may be provided that is operable at a supply voltage (VDDIO) 209 different from VCORE voltage 213. In some arrangements, VDDIO voltage levels may range from around 1.08 V to around 5.5 V depending on the application. In an example implementation, depending on whether an LV mode of operation or an HV mode of operation is to be effectuated, VDDIO may be in a low voltage range (e.g. 1.2 V/1.8 V) or in a high voltage range (e.g., 3.3 V/5 V) as previously noted. In one arrangement, F/S logic may be configured to compare an I/O pad voltage with VDDIO, e.g., when VDDIO is zero volts, to determine a failsafe condition. Further, F/S logic may be configured with appropriate logic circuitry for generating a set of gate control signals that may be used in combination with at least portion of the control signals 215 for controlling transmit operations in HV and LV domains, whereby a logic high value of the data signal 214-1 at the core voltage level may be altered to have a voltage level that is compatible with the HV domain or the LV domain depending on the application scenario's voltage requirements. F/S module 208 may also be configured to generate a body voltage signal NSUB, which may be used to connect the nwell region of all HV PMOS devices connected to the I/O node in order to maintain reliability in certain configurations, e.g., in a failsafe condition, by preventing the parasitic body diodes from turning on as will be set forth below. In some examples, F/S module 208 may also be coupled to a CDM-based ESD protection circuit 210, which may be coupled to an I/O node 299 for protecting the IC device against any voltage spikes that may occur in an example application scenario.

In one arrangement, a first pull-up portion, e.g., portion 202, is operable in a first voltage domain, e.g., an HV domain, in response to the mode select signal 214-3 asserted in a first logic state, e.g., a logic high or a logic low, depending on implementation. A second pull-up portion, e.g., portion 204, is operable in a second voltage domain, e.g., an LV domain, responsive to the mode select signal 214-3 in a second logic state, e.g., a logic low or a logic high, in a complementary manner. As will be set forth in further detail below, each pull-up portion 202, 204 may comprise a respective set of transistor devices compatible with different voltage levels that may be selectively actuated depending on the supply voltage levels of an application scenario.

With respect to pull-down operations for transmitting logic low data values to the I/O node 299, example pull-down portion 206 of the transmit path circuit 200 may be implemented using an n-channel drain extended MOS (DENMOS) device, referred to as MN11, that is operable in a voltage range compatible with different voltage domains. In one example arrangement, MN11 may comprise a 1.8 V DENMOS device that can sustain voltages of around 5.5 V across the drain and source terminals during pull-down operations in some applications. Gate control for MN11 may be provided by p6 control signal, also referred to as ngate control signal in FIG. 2, which may be generated in the core voltage domain, e.g., at 1.5 V, in order to help maintain gate oxide reliability of the M11 device.

In one example implementation, the first pull-up portion 202 includes a first level shifter (LS1) 220 operable to convert voltage levels from the core voltage domain to the first voltage domain, e.g., the HV domain having a voltage range of 3.3 V/5 V, which may be operable as VDDIO supply for HV operations. Level shifter 220 may be coupled to a first transmission gate 222 configured to drive a 5 V PMOS device MP13 operable as a pull-up transistor in HV operations, wherein MP13 is configured to drive the I/O node 299 to a logic high state compatible with the first voltage domain depending on the state of the DIN signal 214-1. In one arrangement, the first transmission gate 222 comprises a 5 V NMOS device MN14 and a 5 V PMOS device MP15, wherein MN14 and MP15 are each actuated by a respective gate control signal generated by the F/S logic module 208. When the transmission gate 222 is on, it is operable to drive the gate of MP13 to a suitable logic level in order to turn MP13 ON in a pull-up operation, whereby the I/O node 299 may be driven to VDDIO (e.g., via a resistor R) under suitable control signaling as will be seen below. Further, a pgate1 signal may be driven by the F/S logic module 208 to I/O pad voltage in order to turn MP13 OFF in a failsafe condition.

In one example implementation, the second pull-up portion 204 includes a second level shifter (LS2) 230 operable to shift voltage levels from the core voltage domain to the second voltage domain, e.g., the LV domain having a voltage range of 1.2 V/1.8 V, that may be operable as VDDIO supply for LV operations. In some examples, the second level shifter 230 may be configured to drive a plurality of transistor devices operating under one or more transmit path control signals, which may comprise devices operable at different voltage levels. By way of illustration, PMOS devices MP16 and MP17 are compatible with core voltage levels (e.g., 1.8 V), PMOS devices MP18 and MP19 are compatible with high voltages (e.g., 5.0 V), and n-channel drain extended MOS (DENMOS) devices MN13 and MN15 are operable at core voltage levels (e.g., 1.8 V). At least a subset of the foregoing devices may be arranged to actuate a pair of p-channel drain extended MOS (DEPMOS) devices MP11, MP12 operable with low voltages (e.g., 1.8 V) that are connected in series at a common drain connection, wherein MP11 is controlled by a gate control signal pgate2 and MP12 is controlled by a gate control signal pgate3 for driving the I/O node 299 via resistor R.

It will be appreciated that DEPMOS devices MP11 and MP12 are advantageous in the implementation shown in FIG. 2 because of their better over-drive capability at lower supply voltages, which helps meet the timing performance requirements in low voltage application scenarios. Further, to ensure reliability of MP11 and MP12 at higher supplies (e.g., 2.6 V-5.5 V) and in failsafe condition, certain additional features and structures may be provided in some examples. As illustrated in FIG. 2, the source and the drain of MP12 are reversed (thereby achieving the common drain connection with MP11) and a transmission gate 232, comprising an n-channel DEMOS (DENMOS) device MN12, and a p-channel DEMOS (DEPMOS) device MP14 is provided to drive pgate3 at the gate of MP12 to the voltage at the I/O node 299 (designated PAD_CDM at the transmission gate 232 input) in high voltage states and/or failsafe conditions. Further, the body terminal of MP12 may also be connected to the I/O node 299, which helps enhance reliability of the device as well as ensure that the parasitic body diodes (e.g., between nwell and drain) are reverse-biased in failsafe mode.

A general operation of the transit path circuit 200 in various modes is set forth below, followed by a description of control signal states in relation to example circuit representations where certain portions of the transit path circuit 200 may be selectively disabled/inactivated in different modes.

As previously noted, a mode select signal, e.g., MODE 214-3, may be provided to select between LV and HV operations in an example application scenario. As such, DENMOS device MN11 is configured as the pull-down path 206 to handle pull-down operations in both HV and LV modes in an example implementation, e.g., by asserting the gate control signal ngate, as previously set forth. Accordingly, only device states relative to pull-up operations in LV and HV domains as well as failsafe mode operation will be exemplified herein. In some examples, control signals MIO_HV and MCORE_HV/MCORE_HV_N may be generated for respectively activating high voltage PMOS devices MP18, MP19 and core voltage DEMOS devices MN12/MP14 of the transmission gate 232 depending on the mode of operation.

In LV mode of operation, MP13 is turned OFF and pull-up is effectuated by the cascode coupled DEPMOS devices MP11 and MP12. In this arrangement, MP12 is maintained in ON condition using DENMOS device MN13, which drives pgate3 to logic low. MP11 is tuned ON or OFF depending on the logic states of the DIN signal 214-1 propagated through core voltage device MP16 and DENMOS device MN15, which is controlled by a core domain control signal p4. MP16 is turned ON using a core domain control signal p3 and turned OFF through LS2 230 and core voltage device MP17.

In HV mode of operation, MP13 is responsible for effectuating pull-up of I/O node 299. In this mode, gate control signal pgate2 is driven high using MP19, thereby ensuring that voltage differences across all terminals of MP11 are equalized during steady state (e.g., VGS, VDS and VDG are nearly zero volts (0 V)) so as to safeguard the reliability of MP11 during HV operations. Because the series path including MP11 and MP12 remains off in HV mode, using 5 V PMOS MP19 does not impact the timing performance of I/O transmissions in this mode. In the example arrangement shown in FIG. 2, core domain device MP16 may not be used to drive pgate2 high since it may cause gate oxide breakdown at high voltages. Accordingly, MP16 is turned OFF using 5 V device MP18 that is controlled by gate control signal MIO_HV. Gate oxide of core domain device MP17 is also protected by driving the gate of MP17 high through LS2 230. In an example arrangement, the following voltage levels for DEPMOS devices may be maintained: $VGS_{MAX}$, $VSB_{MAX}=\pm1.98$ V, $VDG_{MAX}=+1.65$ V/$-5.5$ V and $VDB_{MAX}$=−5.5 V, thereby ensuring all voltages are within safe operating limits during HV operations.

In failsafe mode (e.g., I/O node=5.5 V and VDDIO=0 V), the reliability of MP13 is assured because it is a 5 V device. With respect to the DEPMOS devices MP11 and MP12, appropriate biasing may be maintained by effectuating suitable connections under the failsafe logic control signaling for ensuring device reliability. In one arrangement, the body of MP12 is connected to I/O node 299. Likewise, the gate of MP12 is also connected to I/O node 299 through the transmission gate 232 activated by the failsafe logic. This arrangement ensures that VGS and VBS are 0 V, which is less than 1.98 V. Because $VDG_{MAX}$ can be 5.5 V, MP12 is also safeguarded under this condition. Further, the gate of MP11 is connected to supply using the failsafe logic control signaling, thereby ensuring that VGS is 0 V, which is also less than 1.98 V.

Turning to FIGS. 4A-4D, depicted therein are representative operational states of a transmit path circuit for transmitting logic high and logic low data signals in LV and HV modes of operation according to some examples of the present disclosure. FIG. 5 depicts example signal states and device states effectuated in a transmit path circuit during different voltage modes of operation. Taking FIGS. 4A-4D and 5 together, various LV and HV operations exemplified above with respect to the transmit path circuit 200 may be further described as follows, wherein circuit representations 400A-400D illustrate different states of the circuit 200 activated under applicable control signals. With respect to transmitting a logic low or binary 0 value as a transmit data signal in LV mode of operation, row 502A of table 500 shown in FIG. 5 illustrates the logic levels of the control signals effectuated in the circuit representation 400A of FIG. 4A. With DIN signal 214-1 taking a binary 0 value, p1 and p2 are asserted logic high, p3 and p4 are asserted logic low, and p5 and p6/ngate are asserted logic high. The pgate control signals generated by the F/S logic module 208 are asserted as follows: pgate1 and pgate2 are asserted high and pgate3 is asserted low. Under these conditions, the pull-down DENMOS device MN11 is turned ON, thereby driving the I/O node 299 to a logic low value, e.g., 0 V. With respect to transmitting a logic high or binary 1 value as a transmit data signal in LV mode, row 502B of table 500 illustrates the logic levels of the control signals effectuated in the circuit representation 400B of FIG. 4B. As DIN signal 214-1 takes a binary 1 value, p1 is asserted logic high, p2 is asserted logic low, p3 is tri-stated to a high impedance level, p4 and p5 are asserted logic high, and p6/ngate are asserted logic low. Further, pgate1 is asserted logic high whereas pgate2 and pgate3 are asserted logic low. Under these conditions, the pull-up DEPMOS devices MP11 and MP12 are ON, thereby driving the I/O node 299 to a logic high value, e.g., VDDIO (1.2 V/1.8 V).

Figure 4A:
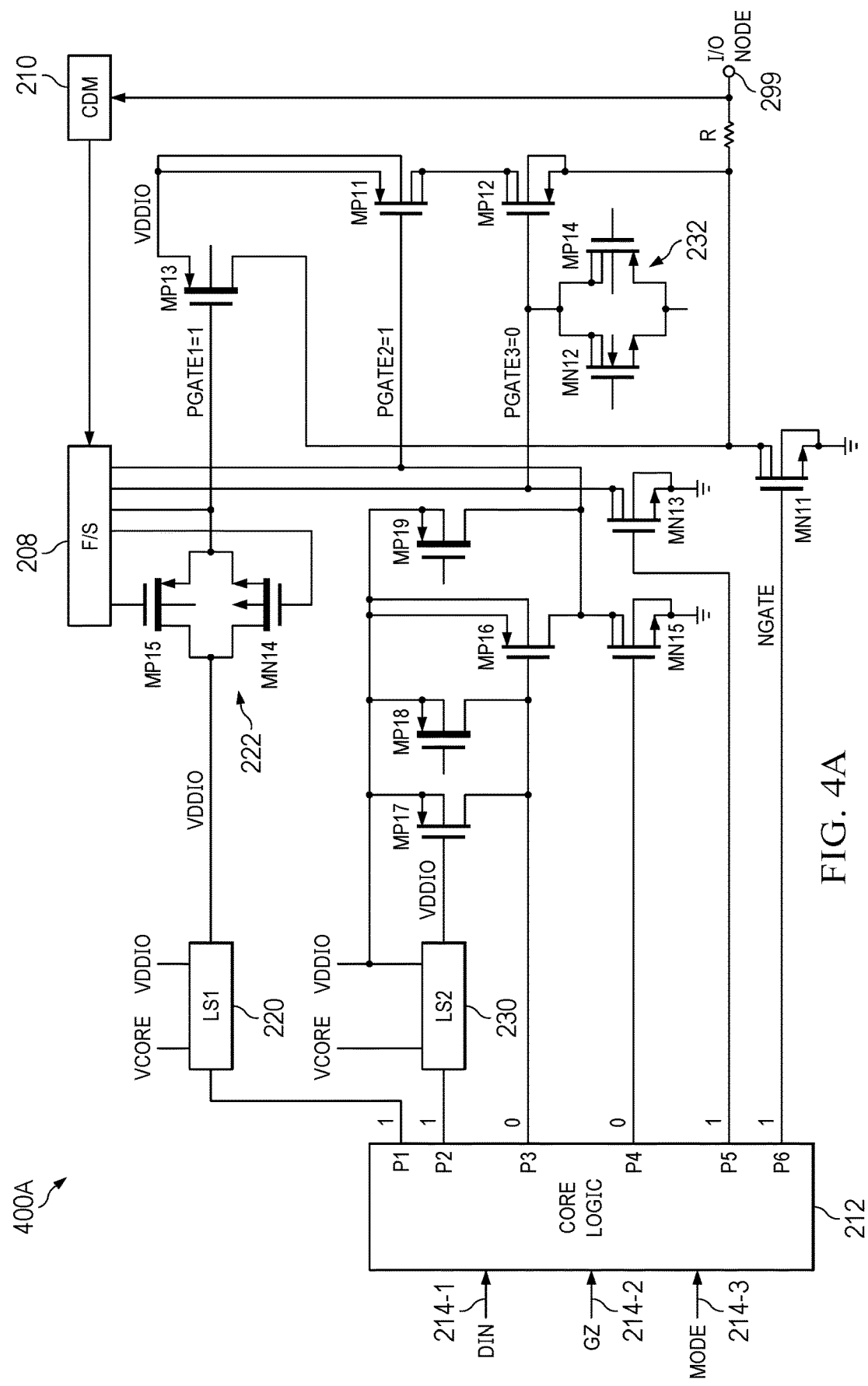
FIGS. 4A-4D depict different operational states of a transmit path circuit for transmitting logic high and logic low data signals in high and low voltage modes of operation according to some examples of the present disclosure.
Figure 4B:
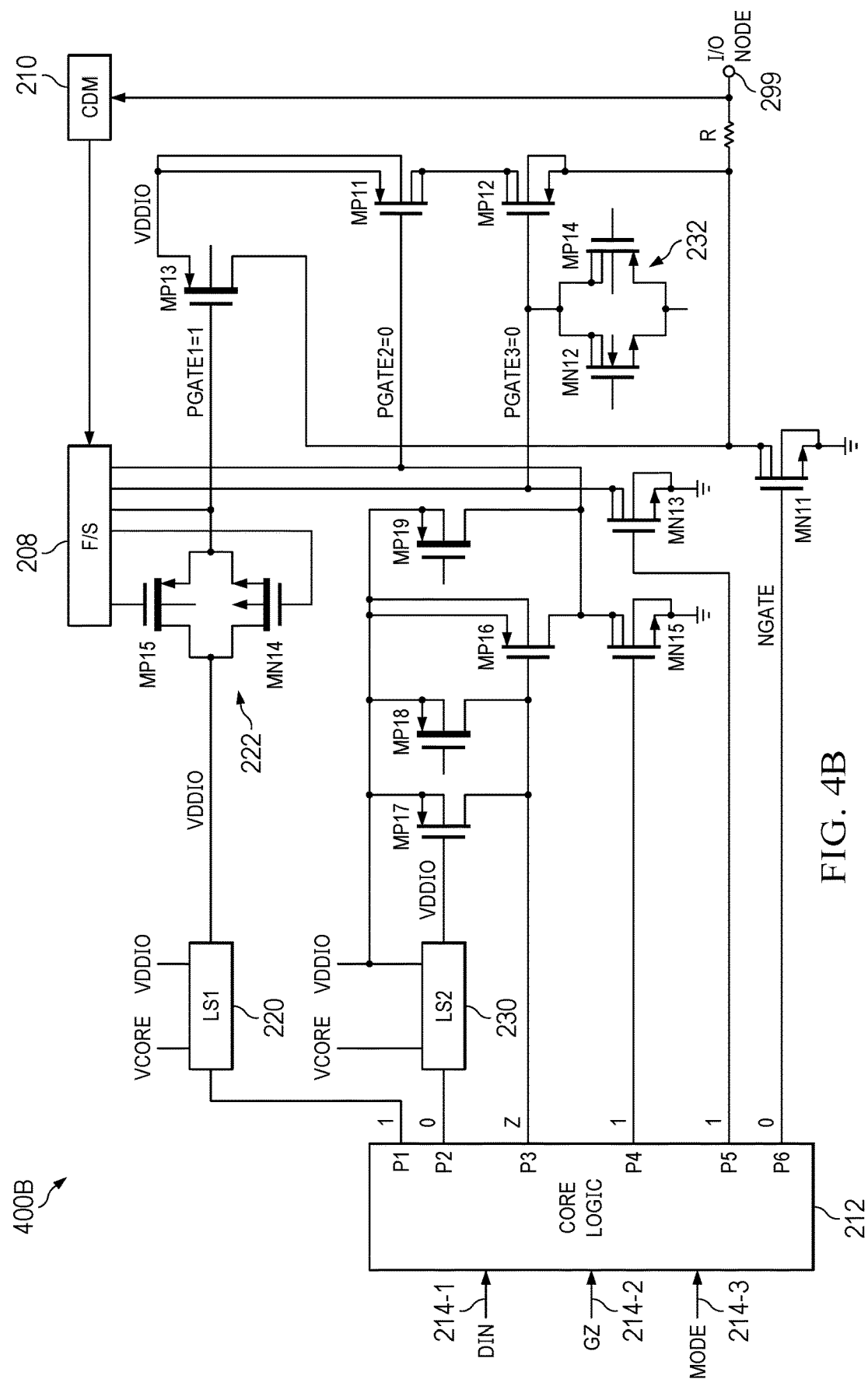
Figure 4C:
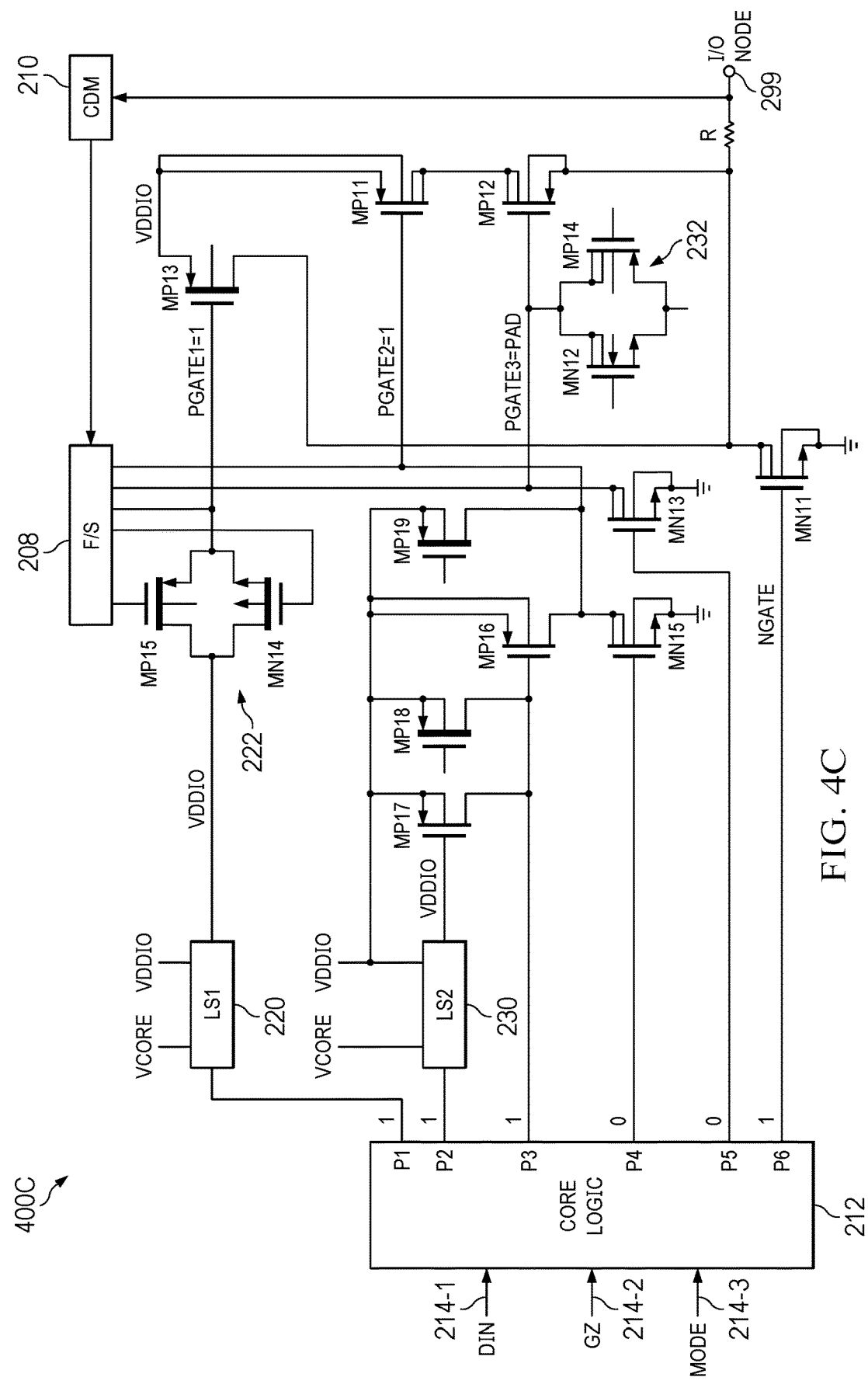
Figure 4D:
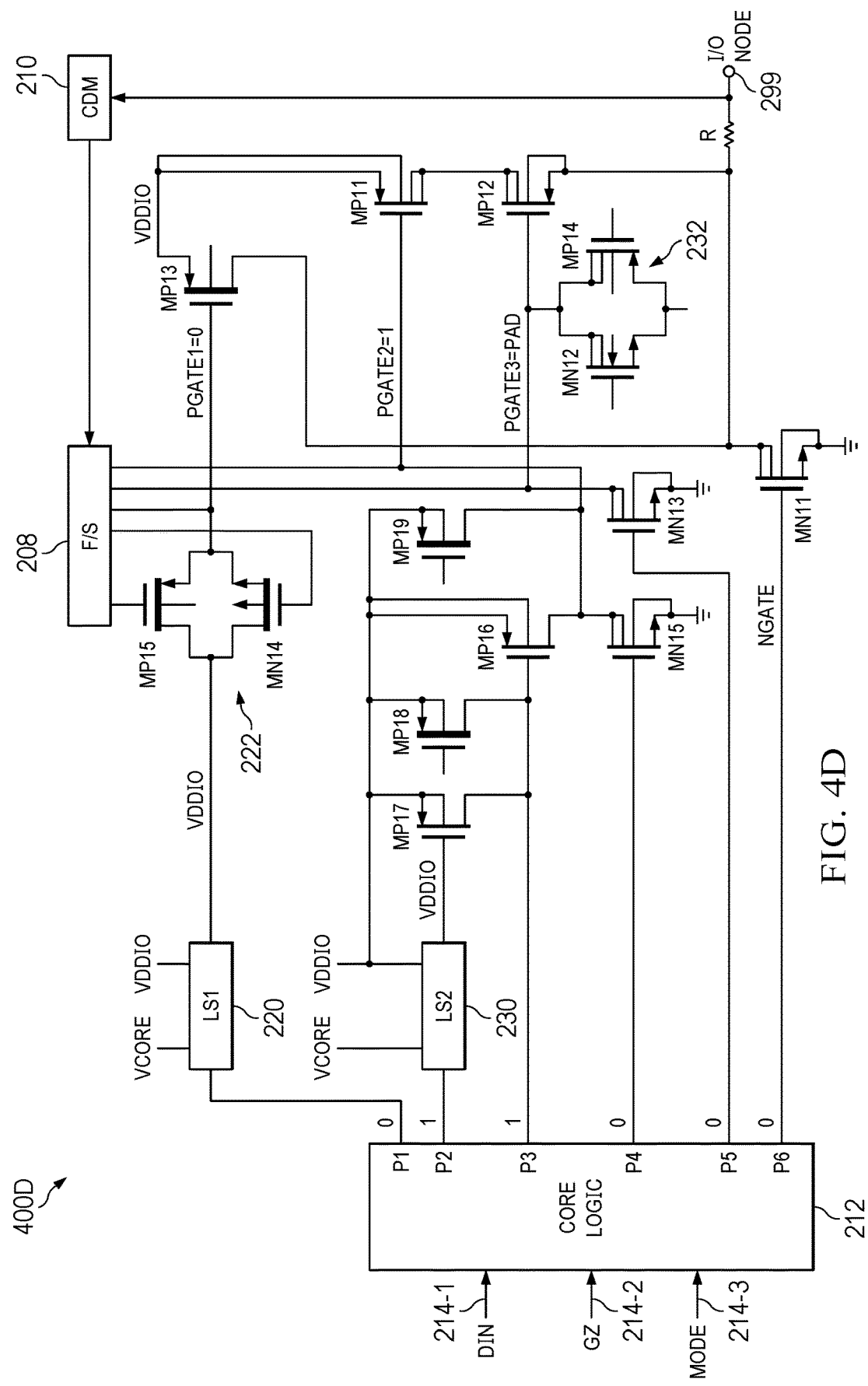
Figure 5:
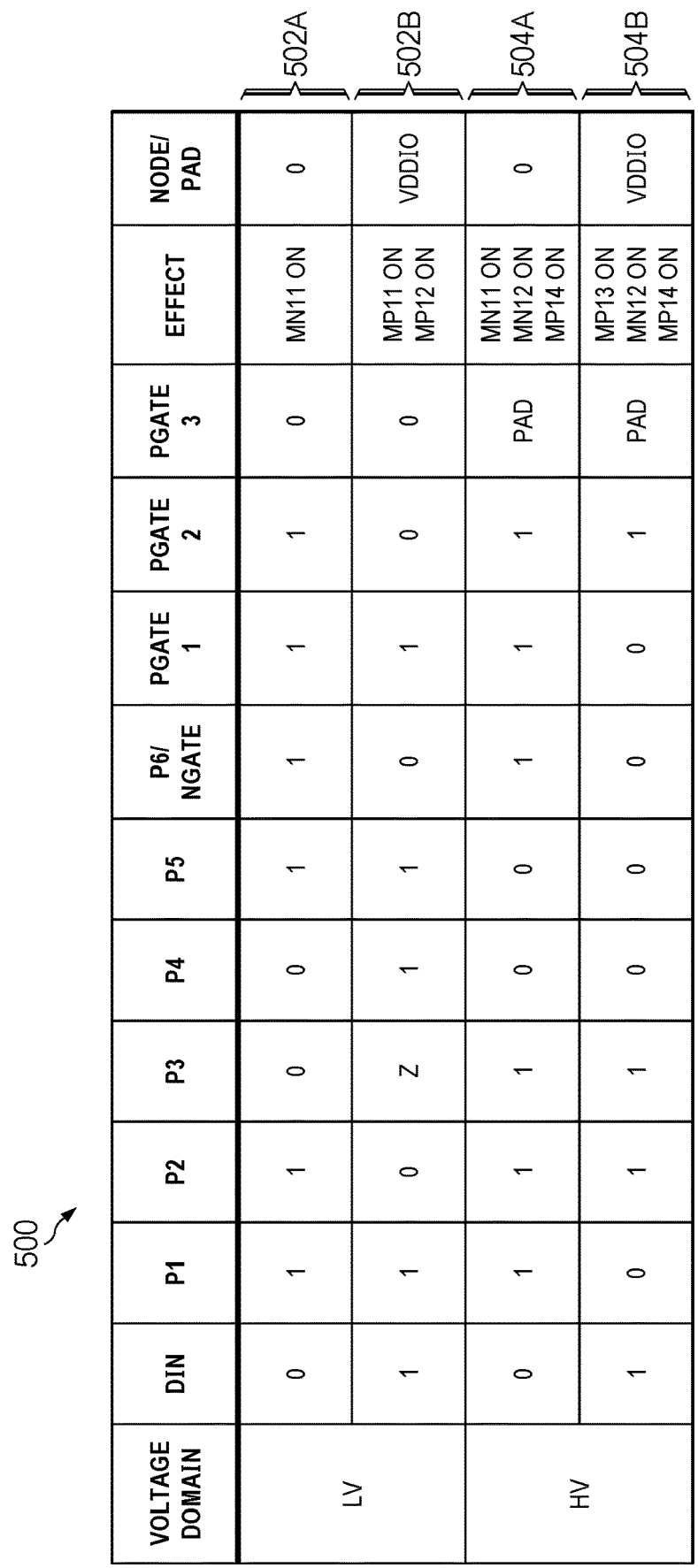
FIG. 5 depicts representative signal states and device states effectuated in a transmit path circuit during different voltage modes of operation according to some examples of the present disclosure.

As to transmitting a logic low or binary 0 value in HV mode of operation, row 504A of table 500 illustrates the logic levels of the control signals effectuated in the circuit representation 400C of FIG. 4C. As DIN signal 214-1 takes a binary 0 value, p1-p3 are asserted logic high, p4 and p5 are asserted logic low, and p6/ngate is asserted logic high. Further, pgate1 and pgate2 are asserted high and pgate3 is driven to the I/O pad voltage. Under these conditions, the pull-down DENMOS device MN11 is turned ON, thereby driving the I/O node 299 to a logic low value, e.g., 0 V. Moreover, MN12 and MP14 are also turned ON in this mode for ensuring reliability. With respect to transmitting a logic high or binary 1 value as a transmit data signal in HV mode, row 504B of table 500 illustrates the logic levels of the control signals effectuated in the circuit representation 400D of FIG. 4D. With DIN signal 214-1 taking a binary 1 value, p1 is asserted logic low, p2 and p3 are asserted logic high, and p4-p6/ngate are each asserted logic high. Also, pgate1 is asserted logic low, pgate2 is asserted logic high and pgate3 is driven to the I/O pad voltage. Under these conditions, the pull-up PMOS device MP13 is turned ON, thereby driving the I/O node 299 to a logic high value, e.g., VDDIO (3 V/5 V). Further, MN12 and MP14 are also turned ON in this mode similar to the logic low transmission in HV domain for ensuring LV device reliability.

Figure 3:
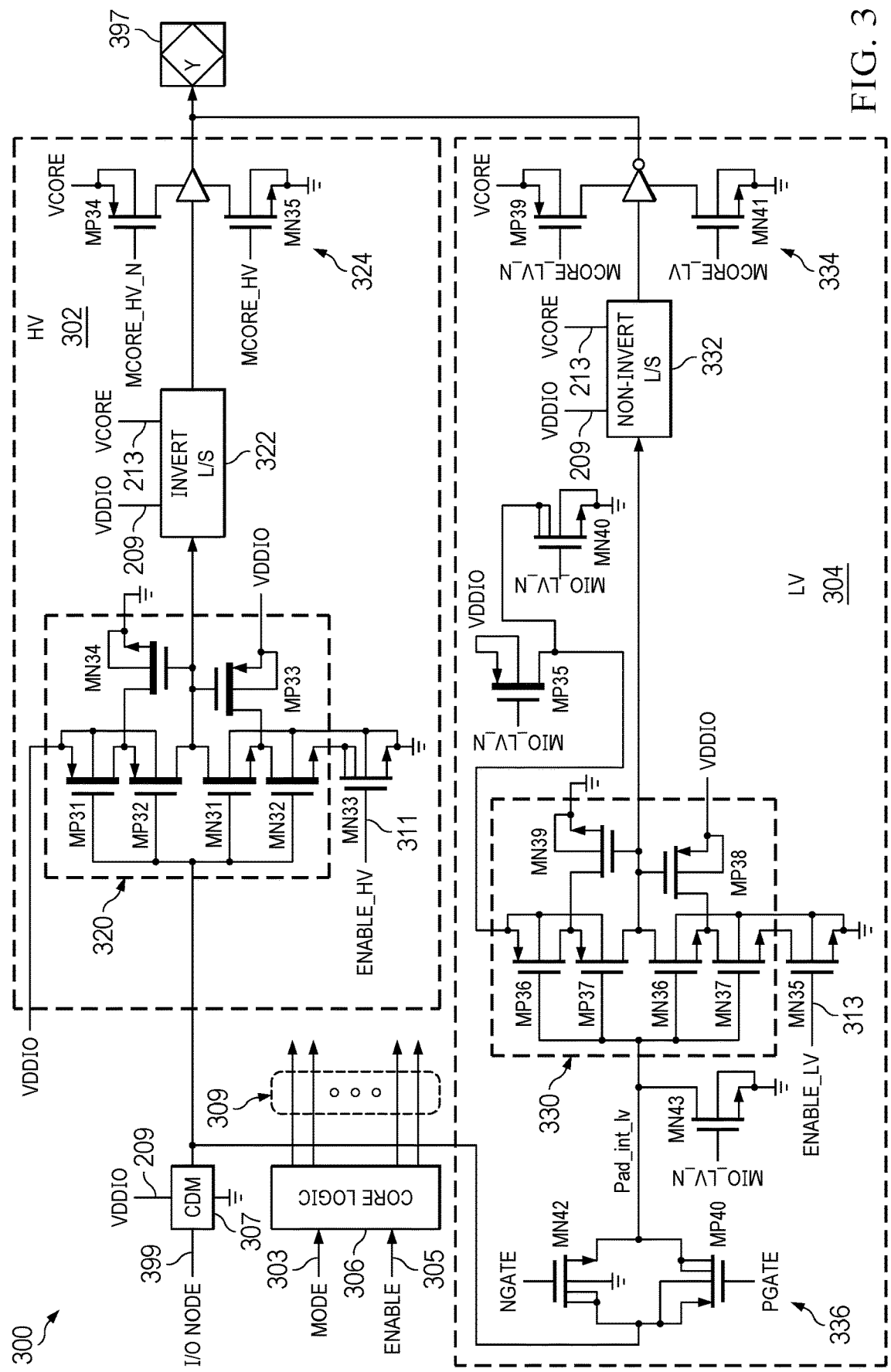
FIG. 3 depicts a schematic block diagram of a receive path circuit of an I/O module according to some examples of the present disclosure.

FIG. 3 depicts a schematic block diagram of a receive path circuit 300 of an I/O module according to some examples of the present disclosure. As with the transmit path circuit 200 shown in FIG. 2, various types of transistor devices used in the receive path circuit 300 may be illustratively distinguished for convenience. Also, similar to the transmit path circuit 200 described above, the receive path circuit 300 may be implemented as comprising two parallel circuit portions, a first receive portion 302 operable in a first voltage domain (e.g., HV domain) and a second receive portion 304 operable in a second voltage domain (e.g., LV domain), wherein the logic states of a mode select signal (e.g., MODE signal 303) may be configured to selectively enable either of the circuit portions depending on the voltages involved in an application scenario. Further, appropriate receive path control signals, collectively referred by reference number 309, may be generated a core logic module 306 for controlling the first and second receive portions 302, 304 in order to effectuate Rx operations in HV and LV domains, respectively, with respect to input data received at an I/O node, e.g., node 399. As will be seen further below, the received data at the I/O node 399 may be propagated via either the first receive portion 302 or the second receive portion 304 to an internal core circuitry node 397 disposed in a core voltage domain (e.g., 1.5 V) of an IC device such as, e.g., IC device 100 shown in FIG. 1.

In one arrangement, a chip level Rx enable signal 305 may be provided to the core logic module 306, wherein suitable logic circuitry may be configured to combine Rx enable signal 305 with MODE signal 303 to generate ENABLE_HV 311 and ENABLE_LV 313 signals as part of control signals 309, operable with respect to enabling the first receive portion 302 and the second receive portion 304, respectively. In one arrangement, the first receive portion 302 may comprise a first Schmitt trigger 320 configured to be driven by the I/O node 399, which may be coupled to a CDM-based ESD circuit 307 in some implementations. In one arrangement, the first Schmitt trigger 320 is actuatable by a first enable control signal (e.g., ENABLE_HV 311) generated by the core logic module 306, wherein the first enable control signal is operable to drive an n-channel DEMOS (DENMOS) device MN33 associated with the first Schmitt trigger 320. Depending on implementation, the first Schmitt trigger 320 may be formed using HV compatible transistors MP31-MP33 and MN31, MN32 and MN34, which can help meet timing constraints as well as reliability requirements at higher supply voltages (e.g., 3.3 V/5 V). During HV mode of operation, the first Schmitt trigger 320 is operable to drive a first level shifter 322 configured to shift or otherwise convert voltage levels from the first voltage domain to the core voltage domain for driving a logic block or buffer 324 configured to assert a logic level at the core circuitry node 397 based on a logic level of the data signal received at the I/O node 399 from an external circuit.

In one example, the second receive portion 304 may comprise a second Schmitt trigger 330 configured to be driven by the I/O node 399 via a transmission gate 336 comprising a DENMOS device MN42 and a DEPMOS device MP40 that are each operable in the second voltage domain responsive to respective gate control signals, ngate and pgate, that may be generated by a failsafe logic module in some implementations (not shown in this FIG.). In one arrangement, the second Schmitt trigger 330 is actuatable by a second enable control signal (e.g., ENABLE_LV 313) generated by the core logic module 306 as noted above, wherein the second enable control signal is operable to drive an LV/core voltage compatible NMOS device MN38 associated with the second Schmitt trigger 330. Depending on implementation, the second Schmitt trigger 330 may be formed using LV/core voltage compatible transistors MP36-MP38 and MN36, MN37 and MN39, which can help meet timing requirements at lower supply voltages (e.g., 1.08 V). In order to ensure the reliability of these devices in HV/failsafe mode, 5 V devices MP35, MN40; DEMOS devices MN42, MP40 arranged as the transmission gate 336; and a 5 V device MN43 may be added as part of the second receive portion 304 in an example implementation. In this mode, MP35 acts as power gating device actuated by gate control signal MIO_LV_N to cut off the I/O supply to the core devices. MN40, also operable under gate control signal MIO_LV_N, may be configured to pull the source of MP36 to ground to ensure the device is not floating.

As noted previously, MN42 and MP40 are DEMOS devices configured as the transmission gate 336, which may be used to block the input I/O node/pad 399 from the LV path in HV/failsafe mode in response to ngate and pgate control signals. HV compatible device MN43 is operable to discharge the signal Pad_int_lv (which is coupled to the second Schmitt trigger 330) to ground in both HV and failsafe modes under the control of MIO_LV_N signal.

In one implementation, MN43 is turned OFF during LV mode of operation and the second Schmitt trigger 330 is operable to drive a second level shifter 332 configured to shift or otherwise convert voltage levels from the second voltage domain to the core voltage domain for driving a logic block or buffer 334 configured to assert a logic level at the core circuitry node 397 as a core data signal based on a logic level of the data signal received at the I/O node 399 from the external circuit.

In one arrangement, the level shifters 322, 332 disposed in the first and second receive portions 302, 304, may be implemented as inverting and non-inverting level shifters, respectively, which in turn are coupled to drive corresponding non-inverting buffer 324 and inverting buffer 334, in order to match any timing delays between the first and second receive portions 302, 304 that may be caused due to the difference in the number of the gates/stages involved in each portion. In additional and/or alternative arrangements, both level shifters 322, 332 may comprise inverting or non-inverting level shifters, with corresponding modifications to the buffer circuits 324, 334, if necessary. In the example implementation shown in FIG. 3, buffer 324 of the first receive portion 302 is implemented as a non-inverting pass gate comprising core voltage devices MP34 and MN35 that are controlled by respective gate control signals MCORE_HV_N and MCORE_HV. In similar fashion, buffer 334 of the second receive portion 304 is implemented as an inverter comprising core voltage devices MP39 and MN41 that are controlled by respective gate control signals MCORE_LV_N and MCORE_LV.

FIGS. 6A and 6B depict representative signal states and device states effectuated in a receive path circuit with respect to different voltage modes of operation according to some examples of the present disclosure. In LV mode of operations (e.g., in a 1.2 V/1.8 V domain), pgate is asserted low while ngate is asserted high, thereby turning ON the DEMOS devices MP40 and MN42 of the transmission gate 336, as exemplified by row 602A of table 600A shown in FIG. 6A. Further, MODE signal is asserted high (in core voltage domain) for indicating LV mode, as exemplified by row 604A of table 600B of FIG. 6B. In addition, row 604A also exemplifies the following logic levels in different domains that may be asserted relative to the various control signals for effectuating LV mode operations: ENABLE_HV is asserted logic low, ENABLE_LV is asserted logic high, MIO_LV_N is asserted logic low, MCORE_LV is asserted logic high, MCORE_LV_N is asserted logic low, MCORE_HV is asserted logic low, and MCORE_LV_N is asserted logic high. Under these conditions, a data value comprising a logic low (0) or a logic high (1) received at the I/O node 399 in LV domain may be propagated to the core circuitry node 397 at a core voltage level (e.g., 1.5 V) as a core data signal.

In HV mode of operations (e.g., in a 3 V/5 V domain), pgate is driven to input voltage (PAD) at the I/O node 399 while ngate is asserted low, thereby turning OFF the DEMOS devices MP40 and MN42, as exemplified by row 602B of table 600A. MODE signal is asserted low (in core voltage domain) for indicating HV mode, as exemplified by row 604B of table 600B. In addition, the following logic levels in different voltage domains may be asserted relative to the various control signals for effectuating HV mode operations as exemplified by row 604B: ENABLE_HV is asserted logic high, ENABLE_LV is asserted logic low, MIO_LV_N is asserted logic high, MCORE_LV is asserted logic low, MCORE_LV_N is asserted logic high, MCORE_HV is asserted logic high, and MCORE_LV_N is asserted logic low. Under these conditions, a data value comprising a logic low (0) or a logic high (1) received at the I/O node 399 in HV domain may be propagated to the core circuitry node 397 at a core voltage level (e.g., 1.5 V) as a core data signal.

With respect to maintaining the reliability of LV devices of the second receive portion 304 during HV/failsafe operations, the DEMOS devices MN42 and MP40 of the transmission gate 336 may suitably biased in order to isolate the LV path. In one arrangement, the drain of MN42 and the source of MP40 are connected to the PAD voltage, wherein the following voltages across the terminals may be effectuated: for MN42, $VGS_{MAX}=0$ V, $VBS_{MAX}=0$ V, $VDG_{MAX}=5.5$ V, and for MP40, $VGS_{MAX}=0$ V, $VBS_{MAX}=0$ V, $VGD_{MAX}=5.5$ V. Because VGD of DEPMOS and VDG of DENMOS can withstand voltages as high as 5.5 V in an example implementation, device reliability may be assured as an integral part of the design consideration.

An I/O module including the transmit and receive path circuits of the present disclosure may be provided in an example implementation to achieve following design parameters in comparison with a baseline design as set forth below:

TABLE 1

| Parameter | Baseline design | Example I/O design | Comments |
|---|---|---|---|
| Tx delay at 1.08 V | 45 ns | 5.5 ns | Delays of the example I/O design of the present disclosure at lower supplies help meet the timing requirements at frequencies of at least 25 MHz. |
| Rx delay at 1.08 V | 43 ns | 2.8 ns | |

TABLE 1-continued

| Parameter | Baseline design | Example I/O design | Comments |
|---|---|---|---|
| Tx delay at 3 V | 8 ns | 5.5 ns | Delays of the example I/O design of the present disclosure at 3 V are also improved by optimizing HV path for higher supply voltages. |
| Rx delay at 3 V | 4.2 ns | 2.7 ns | |

Figure 7A:
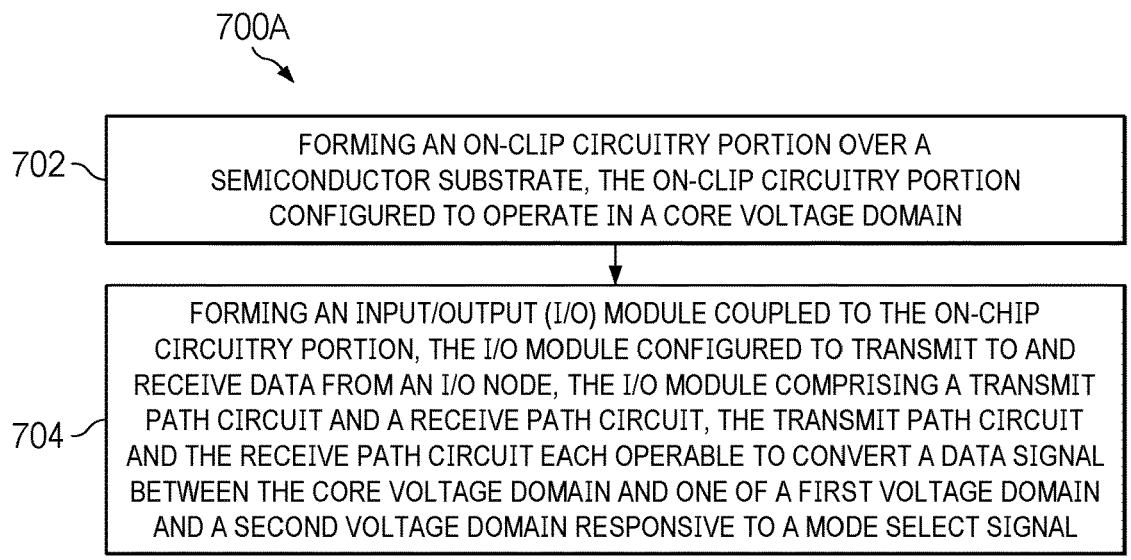
FIGS. 7A-7C are flowcharts relating to an IC fabrication method according to an example of the present disclosure.
Figure 7B:
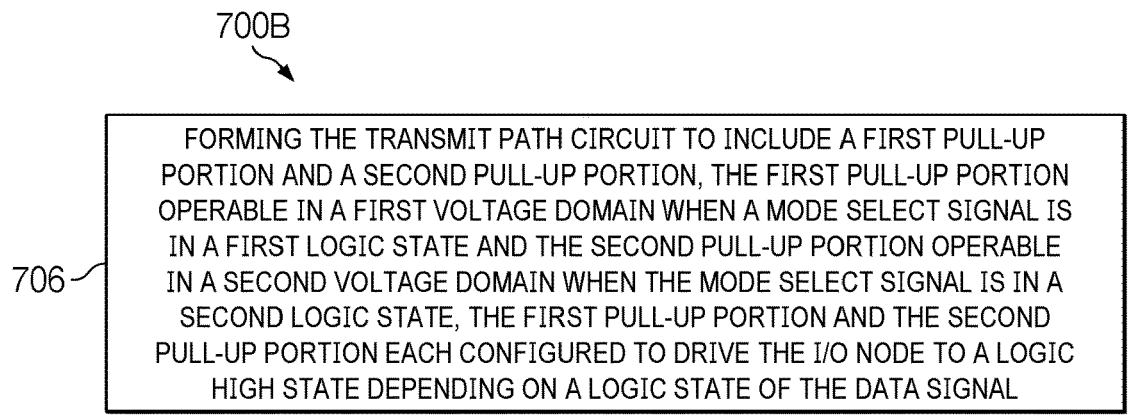
Figure 7C:
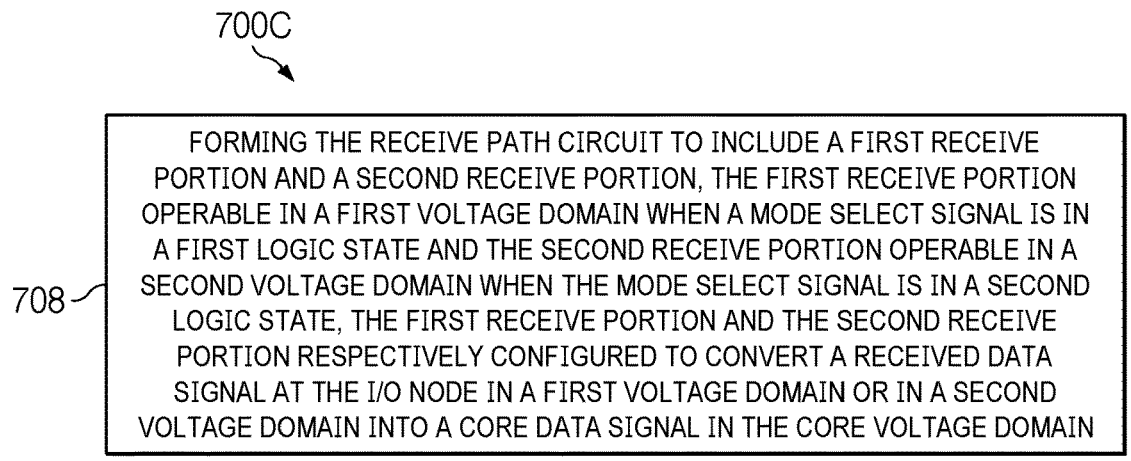

FIGS. 7A-7C are flowcharts relating to an IC fabrication method according to some examples of the present disclosure. Method 700A shown in FIG. 7A may commence with forming an on-chip circuitry portion over or in a semiconductor substrate, wherein the on-chip circuitry portion is configured to operate in a core voltage domain (block 702). At block 704, an I/O module may be formed that may be coupled to the on-chip circuitry portion, wherein the I/O module may be configured to transmit to and receive data from an I/O node. As described in detail hereinabove, the I/O module may be formed to comprise a transmit path circuit and a receive path circuit, wherein the transmit path circuit and the receive path circuit are each operable to convert a data signal between the core voltage domain and one of a first voltage domain and a second voltage domain responsive to a mode select signal. In one arrangement, the transmit path circuit of an example I/O module may be formed to include a first pull-up portion operable in the first voltage domain when the mode select signal is in a first logic state. In one arrangement, the transmit path circuit may be formed to include a second pull-up portion comprising DEMOS devices, wherein the second pull-up portion is operable in the second voltage domain when the mode select signal is in a second logic state, as set forth at block 706 of method 700B shown in FIG. 7B. In one arrangement, the first pull-up portion and the second pull-up portion may each be configured to drive an I/O node to a logic high state depending on a logic state of the data signal.

In one arrangement, the receive path circuit of an example I/O module may be formed to include a first receive portion operable in the first voltage domain when the mode select signal is in a first logic state, and a parallel second receive portion operable in the second voltage domain when the mode select signal is in a second logic state, as set forth at block 708 of method 700C shown in FIG. 7C. In one arrangement, the first receive portion and the second receive portion may be configured, respectively, to convert a received data signal at the I/O node in the first voltage domain or in the second voltage domain into a core data signal in the core voltage domain.

Disclosed examples of the present disclosure may be beneficially implemented in a variety of I/O architectures involving, e.g., serial communications, parallel communications, duplex communications, bidirectional communications, unidirectional communications, synchronous communications, asynchronous communications, serial peripheral interface (SPI) communications, etc., that may be deployed in myriad application scenarios operating in a broad range of voltage domains. In some arrangements, a separate I/O module comprising the transmit and receive path circuits of the present disclosure may be provided for each I/O pad of an IC device. In some arrangements, an I/O module may be configured to drive multiple I/O pads depending on implementation. Irrespective of how a particular I/O architecture is implemented, an example I/O module may be configured to operate across a wide range of supply voltages at the same frequencies without sacrificing reliability and/or timing performance and not incurring additional cost (e.g., in terms of extra masks, static power consumption, etc.). While such example arrangements may be expected to provide various tangible improvements over baseline I/O implementations, no particular result is a requirement unless explicitly recited in a particular claim.

At least some examples are described herein with reference to one or more circuit diagrams/schematics, block diagrams and/or flowchart illustrations. It is understood that such diagrams and/or flowchart illustrations, and combinations of blocks in the block diagrams and/or flowchart illustrations, can be implemented by any appropriate circuitry configured to achieve the desired functionalities. Further, in at least some additional or alternative implementations, the functions/acts described in the blocks may occur out of the order shown in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Also, some blocks in the flowcharts may be optionally omitted. Furthermore, although some of the diagrams include arrows on communication paths to show a primary direction of communication, it is to be understood that communication may occur in the opposite direction relative to the depicted arrows. Finally, other blocks may be added/inserted between the blocks that are illustrated.

It should therefore be clearly understood that the order or sequence of the acts, steps, functions, components or blocks illustrated in any of the flowcharts and/or block diagrams depicted in the drawing Figures of the present disclosure may be modified, altered, replaced, customized or otherwise rearranged within a particular flowchart or block diagram, including deletion or omission of a particular act, step, function, component or block. Moreover, the acts, steps, functions, components or blocks illustrated in a particular flowchart may be inter-mixed or otherwise inter-arranged or rearranged with the acts, steps, functions, components or blocks illustrated in another flowchart in order to effectuate additional variations, modifications and configurations with respect to one or more processes for purposes of practicing the teachings of the present disclosure.

At least some portions of the foregoing description may include certain directional terminology, which may be used with reference to the orientation of some of the Figures or illustrative elements thereof being described. Because components of some examples can be positioned in a number of different orientations, the directional terminology is used for purposes of illustration and is in no way limiting. Likewise, references to features referred to as "first", "second", etc., are not indicative of any specific order, importance, and the like, and such references may be interchanged mutatis mutandis, depending on the context, implementation, etc. Further, the features of examples described herein may be combined with each other unless specifically noted otherwise.

Although various implementations have been shown and described in detail, the claims are not limited to any particular implementation or example. None of the above Detailed Description should be read as implying that any particular component, element, step, act, or function is essential such that it must be included in the scope of the claims. Where the phrases such as "at least one of A and B" or phrases of similar import are recited or described, such a phrase should be understood to mean "only A, only B, or both A and B." Reference to an element in the singular is not intended to mean "one and only one" unless explicitly so stated, but rather "one or more." All structural and functional equivalents to the elements of the above-described implementations that are known to those of ordinary skill in the art are expressly incorporated herein by reference and are intended to be encompassed by the claims appended below.

What is claimed is:

1. An integrated circuit, comprising:
   on-chip circuitry configured to operate in a core voltage domain; and
   an input/output (I/O) module coupled to the on-chip circuitry, the I/O module configured to transmit to and receive data from an I/O node, the I/O module comprising a transmit path circuit and a receive path circuit, the transmit path circuit and the receive path circuit both operable to convert a data signal between the core voltage domain and one of a first voltage domain and a second voltage domain responsive to a mode select signal,
   the transmit path circuit comprising:
     a first pull-up portion operable in the first voltage domain responsive to the mode select signal in a first logic state; and
     a second pull-up portion operable in the second voltage domain responsive to the mode select signal in a second logic state,
     the first pull-up portion and the second pull-up portion both configured to drive the I/O node to a logic-high state depending on a logic state of the data signal.

2. The integrated circuit as recited in claim 1, further comprising a pull-down portion operable to ground the I/O node responsive to a logic-low state of the data signal.

3. The integrated circuit as recited in claim 2, wherein the first pull-up portion includes a first level shifter operable to shift voltage levels from the core voltage domain to the first voltage domain, the first level shifter coupled to a first transmission gate configured to drive a pull-up transistor operable in the first voltage domain, the pull-up transistor configured to drive the I/O node to the logic-high state compatible with the first voltage domain.

4. The integrated circuit as recited in claim 3, wherein the first transmission gate comprises an NMOS device and a PMOS device, each device operable with the first voltage domain, the NMOS device and the PMOS device each actuatable by a respective gate control signal generated by a failsafe logic module.

5. The integrated circuit as recited in claim 2, wherein the second pull-up portion includes a second level shifter operable to shift voltage levels from the core voltage domain to the second voltage domain, the second level shifter configured to drive a plurality of transistor devices arranged to actuate a pair of pull-up transistor devices connected in series at a common drain connection, each pull-up transistor device comprising a p-channel drain extended MOS (DEPMOS) device operable with the second voltage domain, the pair of pull-up transistor devices configured to drive the I/O node to the logic-high state compatible with the second voltage domain.

6. The integrated circuit as recited in claim 5, further comprising a core logic module associated with the I/O module, the core logic module configured to generate a plurality of transmit path control signals for actuating at least one of the first pull-up portion, the second pull-up portion and the pull-down portion.

7. The integrated circuit as recited in claim 6, wherein a first DEPMOS device of the pair of a pair transistor devices is actuatable responsive to the data signal provided to the core logic module and a second DEPMOS device of the pair of pull-up transistor devices is actuatable by a second transmission gate comprising is an n-channel DEMOS (DENMOS) and a p-channel DEMOS (DEPMOS) device that are each operable with the second voltage domain.

8. The integrated circuit as recited in claim 6, wherein the receive path circuit comprises:
   a first receive portion operable in the first voltage domain responsive to the mode select signal in the first logic state; and
   a second receive portion operable in the second voltage domain responsive to the mode select signal in the second logic state,
   the first and second receive portions actuatable by a plurality of receive path control signals generated by the core logic module associated with the I/O module.

9. The integrated circuit as recited in claim 8, wherein the first receive portion comprises a first Schmitt trigger configured to be driven by the I/O node when coupled to an external circuit, the first Schmitt trigger actuatable by a first enable control signal generated by the core logic module responsive to the mode select signal, the first enable control signal operable to drive an n-channel DEMOS (DENMOS) enable device associated with the first Schmitt trigger.

10. The integrated circuit as recited in claim 9, wherein the first Schmitt trigger is operable to drive a first level shifter operable to shift voltage levels from the first voltage domain to the core voltage domain for driving a logic block configured to assert a logic level at a core circuitry node based on a logic level of the data signal received at the I/O node from the external circuit.

11. The integrated circuit as recited in claim 9, wherein the second receive portion comprises a second Schmitt trigger configured to be driven by the I/O node via a transmission gate comprising a DENMOS device and a DEPMOS device that are each operable in the second voltage domain, the second Schmitt trigger actuatable by a second enable control signal generated by the core logic module responsive to the mode select signal, the second enable control signal operable to drive an NMOS enable device associated with the second Schmitt trigger.

12. The integrated circuit as recited in claim 11, wherein the second Schmitt trigger is operable to drive a second level shifter operable to shift voltage levels from the second voltage domain to the core voltage domain for driving a logic block configured to assert a logic level at a core circuitry node based on a logic level of the data signal received at the I/O node from the external circuit.

13. An integrated circuit, comprising:
    on-chip circuitry configured to produce a core data signal at a core voltage level; and
    an input/output (I/O) module including:
      a transmit data circuit configured to generate a transmit data signal from the core data signal in a first voltage domain by a first transmit data path or in a second voltage domain by a second transmit data path, to select the first or the second transmit data path responsive to a mode select signal, and to direct the transmit data signal to an I/O node,
      wherein the transmit data circuit comprises:
        a first pull-up portion operable in the first voltage domain responsive to the mode select signal in a first logic state; and a second pull-up portion operable in the second voltage domain responsive to the mode select signal in a second logic state, the first pull-up portion and the second pull-up portion each configured to drive the transmit data signal to a logic-high state depending on a logic state of the core data signal.

14. The integrated circuit as recited in claim 13, wherein the first pull-up portion includes a first level shifter operable to shift voltage levels from the core voltage level to the first voltage domain, the first level shifter coupled to a first transmission gate configured to drive a pull-up transistor operable in the first voltage domain.

15. The integrated circuit as recited in claim 13, wherein the second pull-up portion includes a second level shifter operable to shift voltage levels from the core voltage level to the second voltage domain, the second level shifter configured to drive a plurality of transistor devices arranged to actuate a pair of pull-up transistor devices connected in series at a common drain connection, each pull-up transistor device comprising a p-channel drain extended MOS (DEPMOS) device operable with the second voltage domain.

16. An integrated circuit, comprising:
an input/output (I/O) module including:
a receive data circuit configured to generate a core data signal from a received data signal from an I/O node by a first receive data path if the received data signal is in a first voltage domain or by a second receive data path if the received data signal is in a second voltage domain, the first receive data path or the second receive data path selected responsive to a mode select signal; and
on-chip circuitry configured to propagate the core data signal at a core voltage level.

17. The integrated circuit as recited in claim 16, wherein the receive data circuit comprises:
a first receive portion operable in the first voltage domain responsive to the mode select signal in a first logic state; and
a second receive portion operable in the second voltage domain responsive to the mode select signal in a second logic state,
the first and second receive portions actuatable by a set of control signals generated by a core logic module associated with the I/O module.

18. The integrated circuit as recited in claim 17, wherein the first receive portion comprises a first Schmitt trigger configured to be driven by the I/O node responsive to the received data signal, the first Schmitt trigger actuatable by a first enable control signal generated by the core logic module responsive to the mode select signal, the first enable control signal operable to drive an n-channel DEMOS (DENMOS) enable device associated with the first Schmitt trigger.

19. The integrated circuit as recited in claim 18, wherein the first Schmitt trigger is operable to drive a first level shifter operable to shift voltage levels from the first voltage domain to the core voltage level for driving a logic block configured to assert a logic level at a core circuitry node based on a logic level of the received data signal.

20. The integrated circuit as recited in claim 18, wherein the second receive portion comprises a second Schmitt trigger configured to be driven by the I/O node responsive to the received data signal, the second Schmitt trigger selectably coupled to the I/O node via a transmission gate comprising a DENMOS device and a DEPMOS device that are each operable in the second voltage domain, the second Schmitt trigger actuatable by a second enable control signal generated by the core logic module responsive to the mode select signal, the second enable control signal operable to drive an NMOS enable device associated with the second Schmitt trigger.

21. The integrated circuit as recited in claim 20, wherein the second Schmitt trigger is operable to drive a second level shifter operable to shift voltage levels from the second voltage domain to the core voltage level for driving a logic block configured to assert a logic level at a core circuitry node based on a logic level of the received data signal.

22. A method of fabricating an integrated circuit (IC) device, the method comprising:
forming an on-chip circuitry portion over a semiconductor substrate, the on-chip circuitry portion configured to operate in a core voltage domain; and
forming an input/output (I/O) module coupled to the on-chip circuitry portion, the I/O module configured to transmit to and receive data from an I/O node, the I/O module comprising a transmit path circuit and a receive path circuit, the transmit path circuit and the receive path circuit each operable to convert a data signal between the core voltage domain and one of a first voltage domain and a second voltage domain responsive to a mode select signal.

23. The method as recited in claim 22, wherein the transmit path circuit is formed to include a first pull-up portion operable in the first voltage domain when the mode select signal is in a first logic state, and a second pull-up portion operable in the second voltage domain when the mode select signal is in a second logic state, the first pull-up portion and the second pull-up portion each configured to drive the I/O node a logic-high state depending on a logic state of the data signal.

24. The method as recited in claim 22, wherein the receive path circuit is formed to include a first receive portion operable in the first voltage domain when the mode select signal is in a first logic state, and a second receive portion operable in the second voltage domain when the mode select signal is in a second logic state, the first receive portion and the second receive portion respectively configured to convert a received data signal at the I/O node in the first voltage domain or in the second voltage domain into a core data signal in the core voltage domain.

* * * * *